(12) United States Patent
Azumano

(10) Patent No.: US 11,387,082 B2
(45) Date of Patent: *Jul. 12, 2022

(54) PLASMA PROCESSING APPARATUS

(71) Applicant: Shibaura Mechatronics Corporation, Yokohama (JP)

(72) Inventor: Hidehito Azumano, Yokohama (JP)

(73) Assignee: SHIBAURA MECHATRONICS CORPORATION, Yokohama (JP)

(*) Notice: Subject to any disclaimer, the term of this patent is extended or adjusted under 35 U.S.C. 154(b) by 246 days.

This patent is subject to a terminal disclaimer.

(21) Appl. No.: 16/581,886

(22) Filed: Sep. 25, 2019

(65) Prior Publication Data

US 2020/0105506 A1    Apr. 2, 2020

(30) Foreign Application Priority Data

Sep. 28, 2018 (JP) .............................. JP2018-183333

(51) Int. Cl.
*H01J 37/32* (2006.01)
*H01B 1/02* (2006.01)

(52) U.S. Cl.
CPC ........ *H01J 37/32816* (2013.01); *H01B 1/026* (2013.01); *H01J 37/3244* (2013.01); *H01J 37/32715* (2013.01); *H01J 2237/002* (2013.01); *H01J 2237/182* (2013.01)

(58) Field of Classification Search
USPC ...................................... 156/345.51; 118/728
See application file for complete search history.

(56) References Cited

U.S. PATENT DOCUMENTS

| | | | | |
|---|---|---|---|---|
| 6,972,071 | B1* | 12/2005 | Tyler | H01J 37/32357 118/715 |
| 8,552,334 | B2* | 10/2013 | Tappan | H01L 21/6719 219/121.48 |
| 8,900,404 | B2* | 12/2014 | Tappan | H01J 37/32623 156/345.43 |
| 9,728,379 | B2* | 8/2017 | Zhang | H01L 21/6831 |
| 2014/0209215 | A1* | 7/2014 | Chuang | H01L 24/43 148/518 |
| 2014/0342568 | A1* | 11/2014 | Sant | H01J 37/321 438/710 |

FOREIGN PATENT DOCUMENTS

JP    2015-207562 A    11/2015

* cited by examiner

*Primary Examiner* — Ram N Kackar
(74) *Attorney, Agent, or Firm* — Pearne & Gordon LLP

(57) ABSTRACT

According to one embodiment, a plasma processing apparatus includes a chamber being possible to maintain an atmosphere more depressurized than atmospheric pressure, a plasma generator generating a plasma inside the chamber, a gas supplier supplying a gas into the chamber, a placement part positioned below a plasma generation region and placing a processed product thereon, a depressurization part depressurizing the chamber, and a power supply electrically connected to an electrode provided on the placement part via a bus bar. The bus bar is formed of an alloy of copper and gold. Gold is more included than copper on a surface side of the bus bar. The bus bar includes a first layer formed of copper and a second layer covering the first layer and formed of an alloy of copper and gold. Gold is more included than copper on a surface side of the second layer.

16 Claims, 5 Drawing Sheets

PLASMA PROCESSING APPARATUS

CROSS-REFERENCE TO RELATED APPLICATIONS

This application is based upon and claims the benefit of priority from Japanese Patent Application No. 2018-183333, filed on Sep. 28, 2018; the entire contents of which are incorporated herein by reference.

BACKGROUND

Field

Embodiments described herein relate generally to a plasma processing apparatus.

Description of the Related Art

In a plasma processing apparatus used for dry etching, CVD, PVD, etc., a placement part placing a processed product is provided. An electrode for attracting ions to the processed product may be provided in the placement part. The electrode and a high frequency power supply are electrically connected via a bus bar (wire member) (for example, Patent Document 1).

Here, when a current is passed through the bus bar, a temperature of the bus bar rises due to Joule heat. Generally, since the bus bar is formed of copper, when the temperature of the bus bar increases, the surface is oxidized and copper oxide is formed. Since a high frequency current flows in the vicinity of the bus bar surface due to a skin effect, when copper oxide with a higher resistance than copper is formed on the bus bar surface, the amount of heat generated increases and the temperature of the bus bar further rises. Therefore, energy loss due to the heat generation further increases, and thus plasma processing performance may drop. Since formation of copper oxide proceeds gradually with use of the plasma processing apparatus, the plasma processing performance results in instability.

In this case, if the bus bar is made large to increase the surface area, temperature rise of the bus bar can be suppressed. However, there is a risk that the enlarged bus bar leads to upsizing of the apparatus and disposition of the bus bar becomes difficult.

The surface of the bus bar also can be coated with gold and/or silver, etc., which are hard to be oxidized. However, since the bus bar used for the plasma processing apparatus is a large size part, coating the bus bar surface with expensive gold and/or silver, etc., results in increase of manufacturing cost. Silver is a material hard to oxidize, but gradually oxidizes, and thus initial fluctuation of the plasma processing performance may occur.

A technique has been proposed, which oxygen is removed from the environment provided with the bus bar by purging the environment provided with the bus bar with inactive gas and/or evacuating. However, in this way, complication and upsizing of the plasma processing apparatus are caused and manufacturing cost increases.

Then, a plasma processing apparatus which can suppress oxidation of the bus bar with a simple and low cost configuration has been desired to be developed.

PRIOR ART DOCUMENT

Patent Document

Patent Document 1 JP 2015-207562 A (Kokai)

SUMMARY

According to an embodiment, a plasma processing apparatus includes a chamber being possible to maintain an atmosphere more depressurized than atmospheric pressure, a plasma generator generating a plasma inside the chamber, a gas supplier supplying a gas into the chamber, a placement part being positioned below a region where the plasma is generated, a processed product being placed on the placement part, a depressurization part depressurizing inside of the chamber, and a power supply electrically connected to an electrode provided on the placement part via a bus bar. The bus bar is formed of an alloy of copper and gold. The gold is more included than the copper on a surface side of the bus bar. The copper is more included than the gold on a center side in a thickness direction of the bus bar. The bus bar includes a first layer formed of the copper and a second layer covering the first layer and formed of an alloy of the copper and the gold. The gold is more included than the copper on a surface side of the second layer. The copper is more included than the gold on a side of the first layer of the second layer.

DETAILED DESCRIPTION

Figure 1:
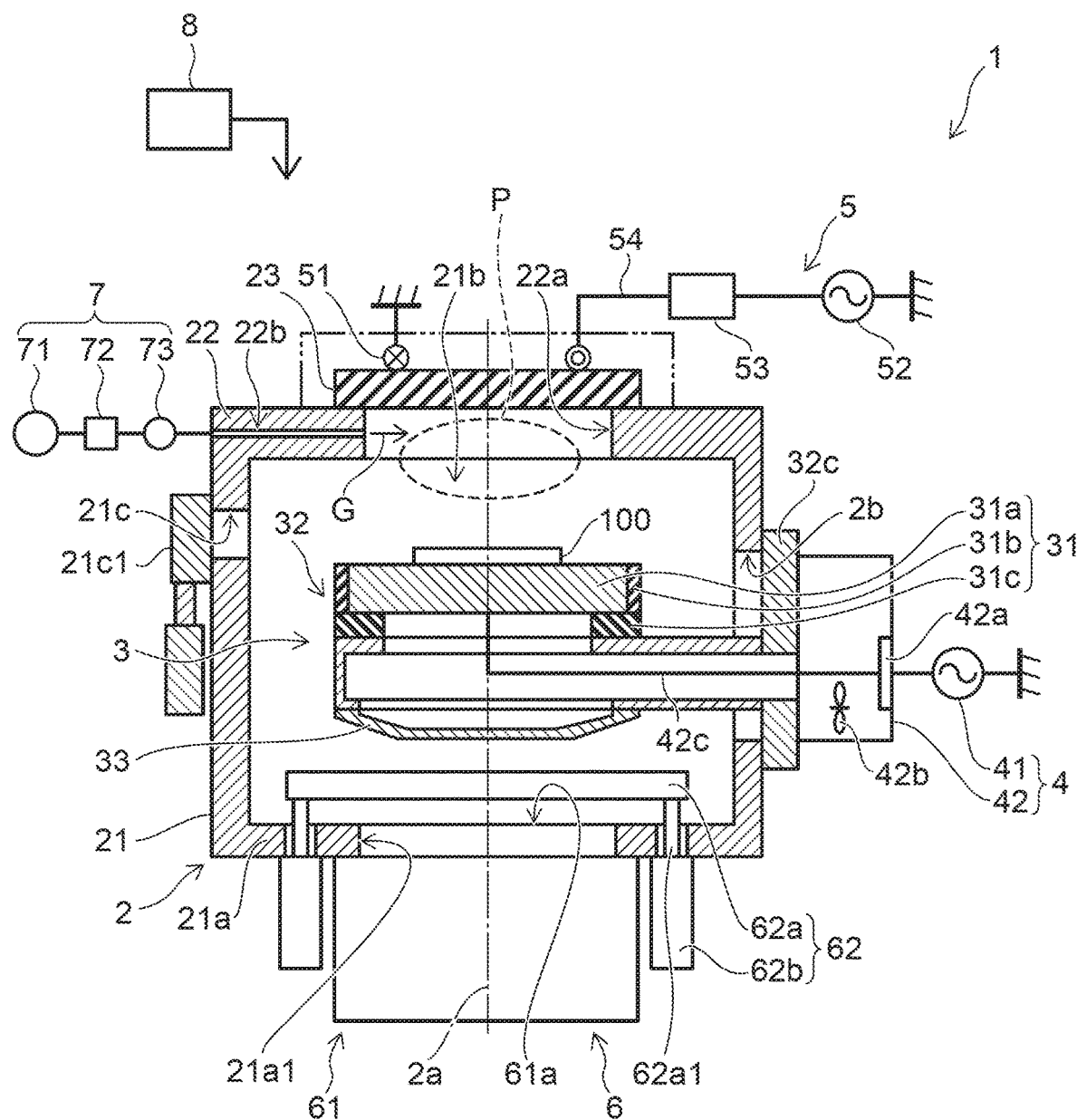
FIG. 1 is a schematic cross sectional view for illustrating a plasma processing apparatus according to the embodiment.

Various embodiments are described below with reference to the accompanying drawings.

In the drawings, similar components are marked with like reference numerals, and a detailed description is omitted as appropriate.

FIG. 1 is a schematic cross sectional view for illustrating a plasma processing apparatus 1 according to the embodiment.

Figure 2:
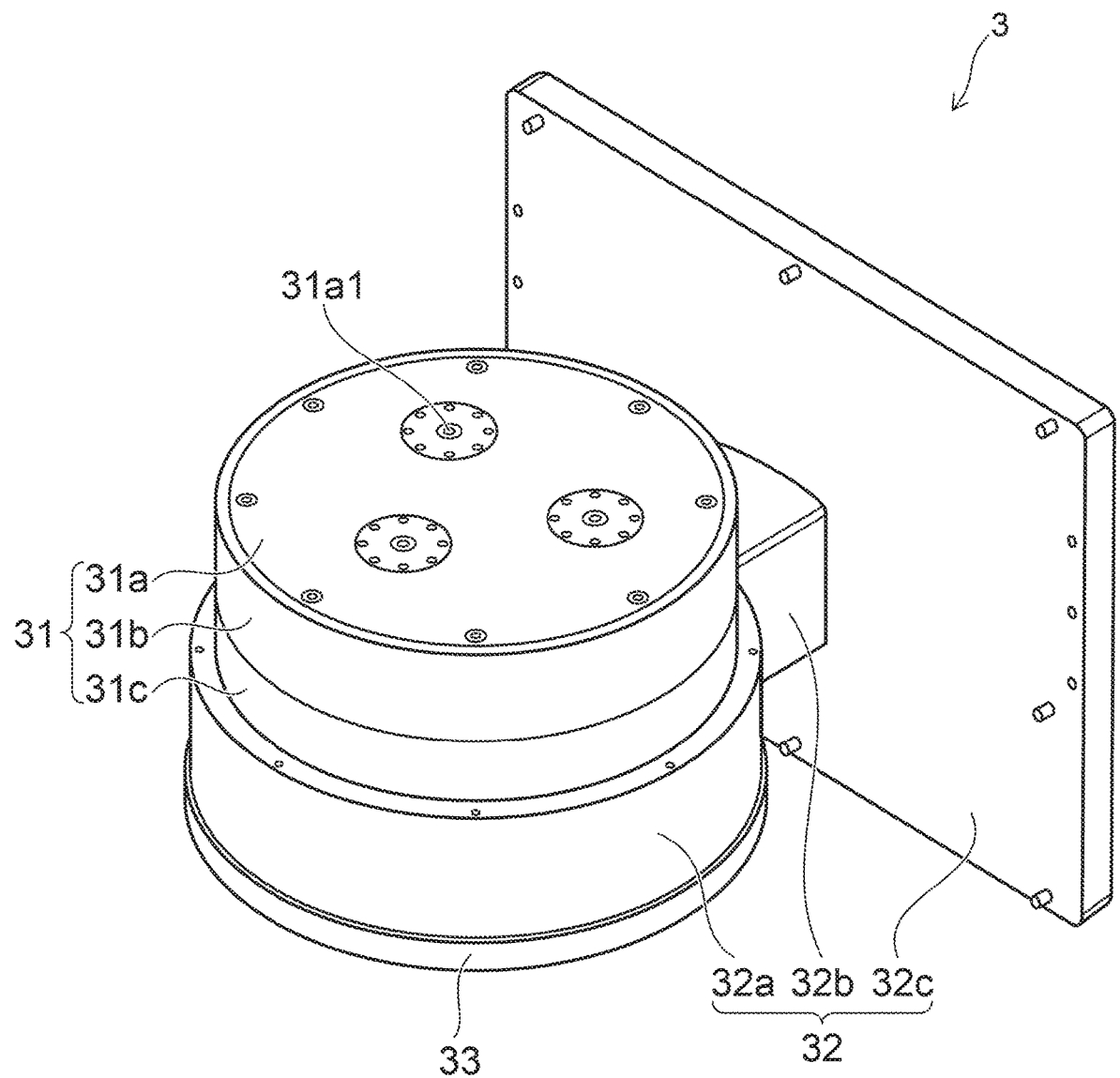
FIG. 2 is a schematic perspective view for illustrating a placement module.

FIG. 2 is a schematic perspective view for illustrating a placement module 3.

Figure 3:
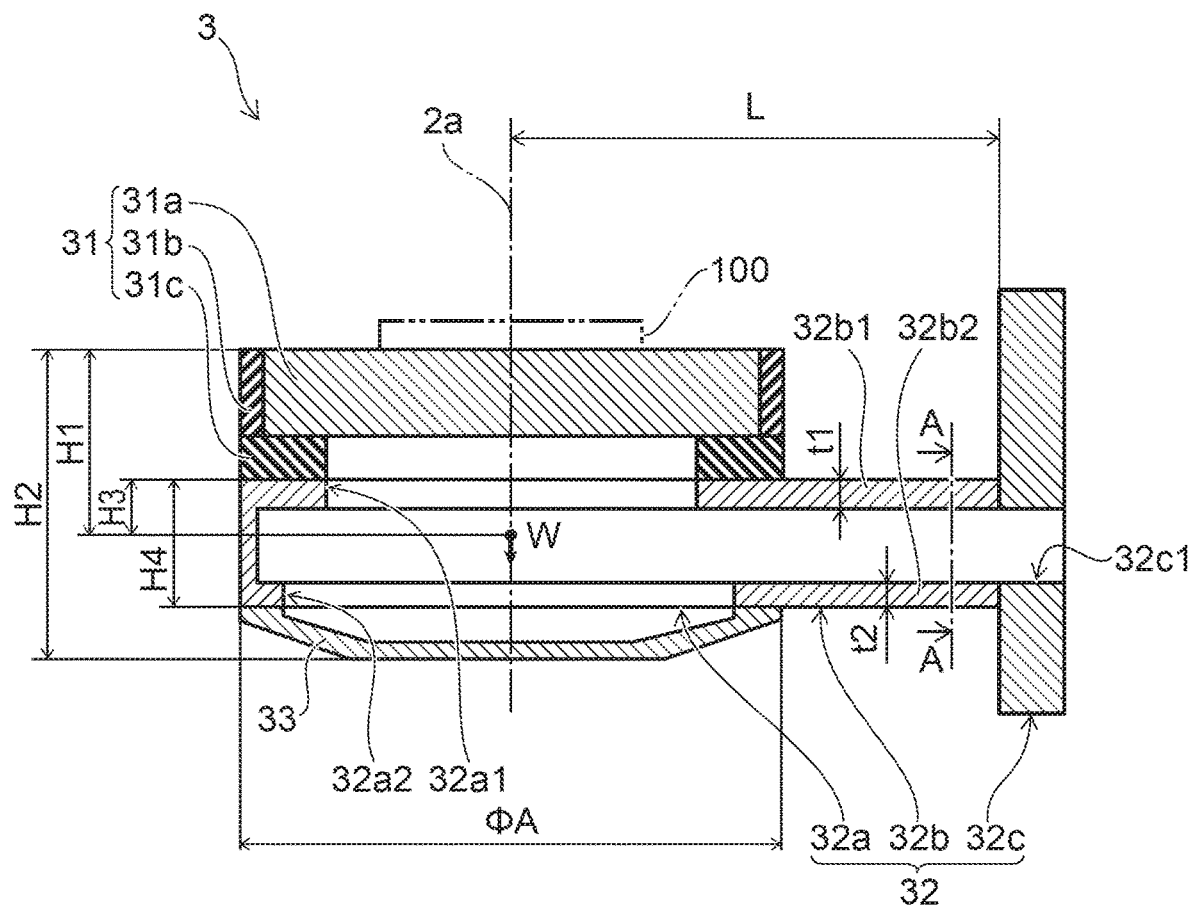
FIG. 3 is a schematic cross sectional view of the placement module.

FIG. 3 is a schematic cross sectional view of the placement module 3.

Figure 4:
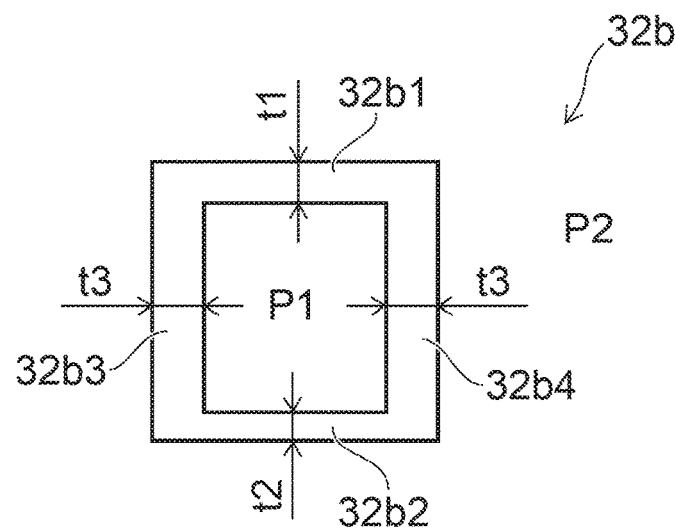
FIG. 4 is a schematic view for illustrating cross section of a beam.

FIG. 4 is a schematic view for illustrating cross section of a beam 32b. FIG. 4 is a schematic cross sectional view along A-A line direction of the beam 32b in FIG. 3.

Figure 5:
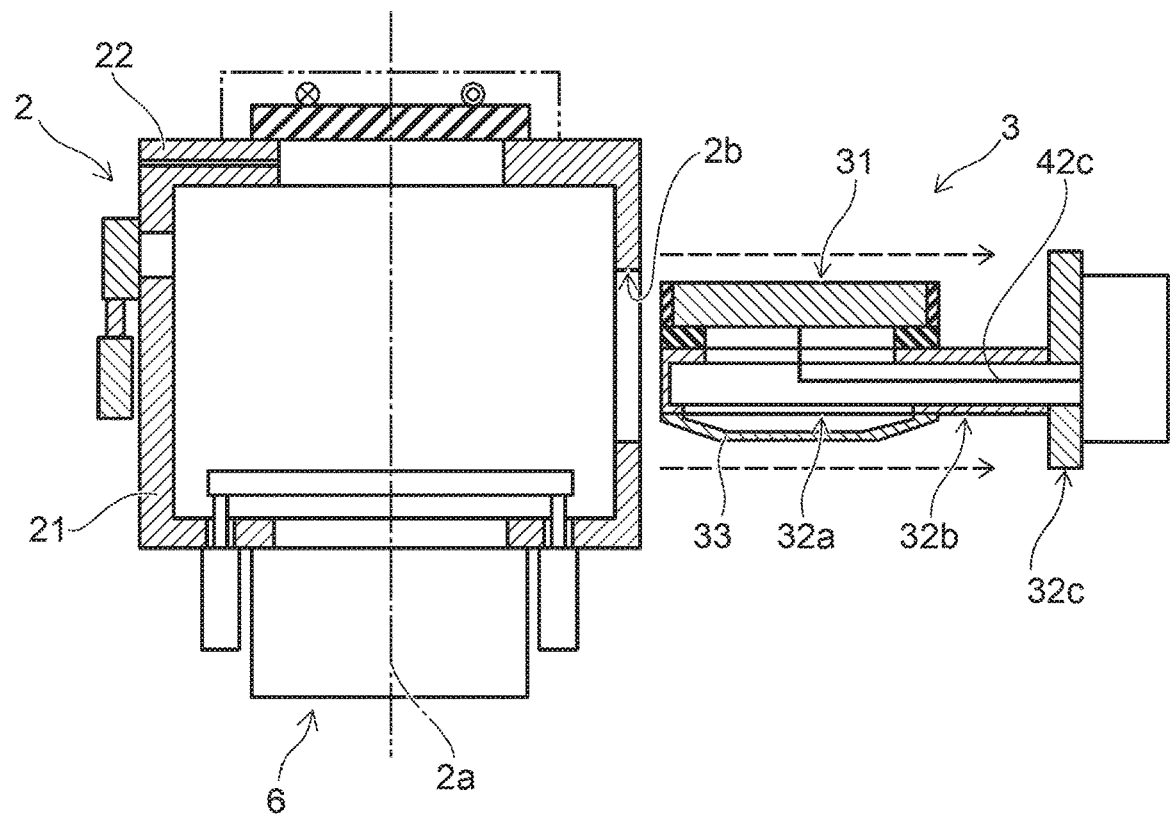
FIG. 5 is a schematic cross sectional view for illustrating detachment of the placement module.

FIG. 5 is a schematic cross sectional view for illustrating detachment of the placement module 3.

FIG. 5 omits a power supply part 4, a power supply part 5, a gas supplier 7, and a controller 8 or the like in order to avoid complications.

As shown in FIG. 1, the plasma processing apparatus 1 includes a chamber 2, the placement module 3, the power supply part 4, the power supply part 5, a depressurization part 6, the gas supplier 7, and the controller 8.

The chamber 2 has an airtight structure which is possible to maintain an atmosphere more depressurized than an atmospheric pressure.

The chamber 2 includes a main body part 21, a top board 22, and a window 23.

The main body part 21 presents an almost cylindrical shape, and a bottom plate 21a is provided integrally on one end. Other end of the main body part 21 is open. The main body part 21 can be formed of, for example, a metal such as an aluminum alloy. The main body part 21 can be grounded. A region 21b where plasma P is generated is provided inside the main body part 21. The main body part 21 is provided with a carry-in-and-out port 21c for carrying in and out a processed product 100. The carry-in-and-out port 21c is configured to be closed tightly by a gate valve 21c1.

The processed product 100 can be, for example, a photomask, a mask blank, a wafer, a glass substrate or the like. However, the processed product 100 is not limited to the illustration.

The top board 22 presents a plate shape, and is provided to close the opening of the main body part 21. The top plate 22 can be provided to confront the bottom plate 21a. A hole 22a piercing in a thickness direction is provided in a center region of the top board 22. The center of the hole 22a can be provided on a center axis 2a of the chamber 2 (main body part 21). The hole 22a is provided so that an electromagnetic wave radiated from an electrode 51 is transmitted. The top board 22 can be formed of, for example, a metal such as an aluminum alloy.

The window 23 presents a plate shape, and is provided on the top board 22. The window 23 is provided to close the hole 22a. The window 23 can transmit the electromagnetic wave, and is formed of a material which is hard to be etched when an etching process is performed. The window 23 can be formed of, for example, a dielectric material such as quartz.

As shown in FIG. 2 and FIG. 3, the placement module 3 includes a placement part 31, a supporting part 32, and a cover 33.

The placement module 3 has a cantilever structure protruding into the chamber 2 (main body part 21) from a side surface of the chamber 2 (main body part 21) and being provided with the placement part 31 on the tip side. The processed product 100 is placed on the placement part 31. The placement part 31 is positioned below the region 21b where the plasma P is generated (see FIG. 1).

The placement part 31 includes an electrode 31a, an insulating ring 31b, and a pedestal 31c.

The electrode 31a can be formed of a conductive material such as a metal. An upper surface of the electrode 31a can be a placement surface for placing the processed product 100. The electrode 31a can be, for example, screwed to the pedestal 31c. The electrode 31a can incorporate a pickup pin 31a1, and a temperature controller or the like. The pickup pin 31a1 can be provided multiply.

The multiple pickup pins 31a1 present a rod, and are provided enable to protrude from the upper surface of the electrode 31a. The multiple pickup pins 31a1 are used when delivering the processed product 100. Therefore, the multiple pickup pins 31a1 are protruded from the upper surface of the electrode 31a and pulled into the electrode 31a by a not shown drive part. The number and disposition of the multiple pickup pins 31a1 can be changed appropriately depending on a size and a planar shape, etc. of the processed product 100.

The temperature controller can be, for example, a circulation line (flow path) of a refrigerant and a heater or the like.

The temperature controller controls, for example, the temperature of the electrode 31a and additionally the temperature of the processed product 100 placed on the electrode 31a on the basis of an output from a not shown temperature sensor.

The insulating ring 31b presents a ring shape, and covers a side surface of the electrode 31a. The insulating ring 31b can be formed of, for example, a dielectric material such as quartz.

The pedestal 31c is provided between the electrode 31a and a mounting part 32a of the supporting part 32. The pedestal 31c is provided in order to insulate the electrode 31a from the supporting part 32. The pedestal 31c can be formed of, for example, a dielectric material such as quartz. The pedestal 31c can be, for example, screwed to the mounting part 32a of the supporting part 32.

The supporting part 32 supports the placement part 31 in an internal space of the chamber 2. The supporting part 32 is disposed to extend between the side surface of the chamber 2 and the portion below the placement part 31.

The supporting part 32 includes the mounting part 32a, the beam 32b, and a flange 32c. The mounting part 32a, the beam 32b, and the flange 32c can be formed of, for example, an aluminum alloy, etc.

The mounting part 32a is positioned below the placement part 31 in the internal space of the chamber 2. The mounting part 32a can be provided so that the center of the mounting part 32a is positioned on the center axis 2a of the chamber 2. The mounting part 32a presents a cylindrical shape, a hole 32a1 is provided on an end face on the placement part 31 side, and a hole 32a2 is provided on an end face on an opposite side of the placement part 31 side. A bus bar 42c and a piping for refrigerant or the like are connected to the electrode 31a via the hole 32a1. The hole 32a2 is used when connecting the bus bar 42c and the piping for refrigerant or the like and maintaining the electrode 31a. The placement part 31 (pedestal 31c) is provided on the end face on the placement part 31 side of the mounting part 32a. Therefore, a planar shape of the mounting part 32a can be the same as a planar shape of the placement part 31. A plane dimension of the mounting part 32a can be approximately the same or slightly larger than a plane dimension of the placement part 31.

One end of the beam 32b is connected to a side surface of the mounting part 32a. Other end of the beam 32b is connected to the flange 32c via a hole 2b (corresponding to one example of a first hole) piercing the side surface of the chamber 2. The beam 32b extends in the internal space of the chamber 2 from the side surface of the chamber 2 toward the center axis 2a of the chamber 2. The beam 32b can present a square tube. The internal space of the beam 32b is connected to an outside space (atmospheric space) of the chamber 2 via a hole 32c1 provided in the flange 32c. Therefore, the bus bar 42c contacts the atmospheric space. If the internal space of the beam 32b is connected to the outside space of the chamber 2, a pressure P1 of the internal space of the beam 32b is the same as a pressure P2 (for example, atmospheric pressure) of the outside space of the chamber 2. The internal space of the beam 32b can be connected to an internal space of the mounting part 32a. In this case, a pressure of an internal space of the supporting part 32 is the same as the pressure (for example, atmospheric pressure) of the outside space of the chamber 2.

As shown in FIG. 1, the flange 32c is attached to an outer wall of the chamber 2. The hole 2b is provided on the side surface of the chamber 2. The hole 2b has a size and a shape through which the placement part 31 attached to the mounting part 32a can pass. Therefore, as shown in FIG. 5, the placement module 3 provided with the placement part 31 can be detached from the chamber 2 and the placement module 3 provided with the placement part 31 can be attached to the chamber 2 via the hole 2b. That is, it is possible to carry the mounting part 32a and the beam 32b provided with the placement part 31 in the chamber 2 and carry out from the chamber 2 via the hole 2b. A slider also can be provided on the outer wall of the chamber 2 in order to make it easy to attach and detach the placement module 3.

The flange 32c presents a plate, and includes the hole 32c1 piercing in a thickness direction (see FIG. 3). The flange 32c can be, for example, screwed to the outer wall of the chamber 2.

As shown in FIG. 3, the cover 33 is provided on the end face on the opposite side of the placement part 31 side of the mounting part 32a. The cover 33 can be, for example, screwed to the mounting part 32a. The hole 32a2 is closed tightly by attaching the cover 33 to the mounting part 32a. The shape of the cover 33 is not particularly limited, the cover 33 may be dome shaped, and may be plate shaped. The cover 33 can be formed of, for example, an aluminum alloy, etc.

Here, if the supporting part 32 has a cantilever structure, a space can be produced below the placement part 31 provided in the internal space of the chamber 2, and thus the depressurization part 6 can be disposed immediately below the placement part 31. If the depressurization part 6 is disposed immediately below the placement part 31, the effective pumping speed is large, and the axisymmetric exhaust without deviation is easily performed. If the supporting part 32 has a cantilever structure, it is able to detach the supporting part 32 provided with the placement part 31 from the chamber 2, and to attach the supporting part 32 provided with the placement part 31 to the chamber 2 in a horizontal direction. Therefore, compared with the case where the placement part is fixed to the bottom surface of the chamber 2, maintenance of the plasma processing apparatus becomes easy.

However, the electrode 31a made of a metal is provided on the placement part 31. The pickup pins 31a1 and its drive part, the temperature controller such as the circulation line of refrigerant and the heater or the like also are provided on the placement part 31. Therefore, the weight of the placement part increases. When the weight of the placement part 31 provided on the tip side of the supporting part 32 increases, the load is deviated due to being supported by one side, the tip of the beam 32b supporting the placement part 31 bends downward, and there is a risk that the placement part 31 tilts. For example, the weight of the placement part 31 may be 56 to 70 kgf (weight kilogram). In such a case, the tip of the placement module 3 may lower downward by approximately 0.2 mm.

Since the processed product 100 is placed on the placement part 31, the placement surface for placing the processed product 100 needs an area not less than at least an area of main face of the processed product 100, and the plane dimension of the placement part 31 becomes large. Therefore, the placement part 31 with a large plane dimension tilts, there is a risk that a gas flow in the chamber 2 is disturbed, a plasma density is non-uniform, and processing characteristics are non-uniform.

In this case, if the cross sectional dimension of the beam 32b supporting the placement part 31 is increased in order to suppress the tilt of the placement part 31, there is a risk that the exhaust is disturbed, the effective pumping speed is decreased, and the axisymmetric exhaust without deviation becomes difficult. If the beam 32b supporting the placement part 31 is multiple, the cross sectional dimension of one beam 32b can be made small, and the effective pumping speed can be suppressed from decreasing. The axisymmetric exhaust without deviation also can be performed by arrangement of the multiple beams 32b. However, if the beam 32b supporting the placement part 31 is multiple, portions fixing the beams 32b to the side surface of the chamber 2 increase, and thus there is a risk that it becomes difficult to attach and detach the supporting part, and the maintainability is reduced.

Then, the supporting part 32 according to the embodiment is provided with the beam 32b having the space inside. As described previously, the internal space of the beam 32b and the outside space of the chamber 2 are connected. That is, the pressure in the internal space of the beam 32b is the same as the pressure in the space outside the chamber 2 (for example, atmospheric pressure). As shown in FIG. 3 and FIG. 4, in the case where a thickness of a side portion (a side portion on upper side) 32b1 on the placement part 31 side of the beam 32b is taken as t1, and a thickness of a side portion (a side portion on lower side) 32b2 on the opposite side of the placement part 31 side of the beam 32b is taken as t2, "t1>t2".

Therefore, when performing the plasma processing, a uniform load depending on a difference between the pressure inside the beam 32b and the pressure outside the beam 32b is added to the side portions 32b1, 32b2 of the beam 32b. In this case, the uniform load applied to the side portion 32b1 of the beam 32b and the side portion 32b2 of the beam 32b is the same. Therefore, if "t1>t2", the deflection amount of the side portion 32b1 of the beam 32b is larger than the deflection amount of the side portion 32b2 of the beam 32b. As a result, since the tip of the beam 32b bends upward, it is possible to offset the downward deflection due to the weight of the placement part 31 by the upward deflection due to the pressure difference. Specific dimensions of the thicknesses t1, t2 can be appropriately determined by experiments and simulation.

Here, as shown in Table 1, the deflection of the beam 32b has been analyzed by a finite element analysis with addition of the weight of the placement part 31 as a condition, in the case where the thickness (t1) of the side portion 32b1 of the beam 32b and the thickness (t2) of the side portion 32b2 of the beam 32b are changed. In Table 1, the deflection amount in the case where the pressures outside and inside the beam 32b are the same (both are atmospheric pressure) is taken as "self-deflection", and the deflection amount in the case where the pressure (0.1 Pa) outside the beam 32b is lower than the atmospheric pressure and the pressure inside the beam 32b is the atmospheric pressure is taken as "load deflection".

TABLE 1

| No. | t1 | t2 | self-deflection | unit (mm) load deflection |
|---|---|---|---|---|
| 1 | 16 | 9 | −0.09 | 0.10 |
| 2 | 9 | 9 | −0.06 | −0.24 |
| 3 | 16 | 16 | −0.07 | −0.25 |
| 4 | 9 | 16 | −0.04 | −0.26 |

As a result, as in No. 1, while the beam 32b bends upward only under the condition of "t1>t2", as in No. 2 to 4, it is confirmed that the beam 32b bends downward under the both conditions of "t1=t2" and "t1<t2". This analysis results in that the beam 32b bends upward as in No. 1 with addition of only the weight of the placement part 31 as a condition, however the weight or the like of the product to be processed also is loaded practically, and thus the weight is further loaded. It is considered that the beam 32 bends downward by the further loaded weight and the upward deflection is offset, and then the placement surface of the placement part 31 becomes flat.

Table 2 shows a range of dimensions of the components of the plasma processing apparatus of the embodiment satisfying this condition. In this case, the beam 32b is formed of an aluminum alloy, and the pressure of the outside space of the beam 32b (internal pressure of the chamber 2) can be approximately 0.1 to 100 Pa.

L is a distance between the outer wall and the center axis of the chamber 2, φA is a diameter dimension of the placement surface on the placement part 31, H1 is a dimension from a center of gravity w to the placement surface, H2 is a dimension from the upper surface of the placement part 31 to the lower surface of the cover 33, H3 is a dimension from the center of gravity w to the upper side surface of the side portion 32b1, H4 is a dimension of the beam 32b in a vertical direction.

TABLE 2

|  | range |
| --- | --- |
| L (mm) | 260~350 |
| φA (mm) | 315~450 |
| H1 (mm) | 100~150 |
| H2 (mm) | 280~360 |
| H3 (mm) | −10~20 |
| H4 (mm) | 80~110 |
| W (kgf) | 56~70 |
| t1 (mm) | 14~18 |
| t2 (mm) | 8~10 |

As shown in Table 2, for example, if L is approximately 260 to 350 mm and the weight of the placement part 31 is approximately 56 to 70 kgf (weight kilogram), t1=14 to 18 mm, t2=8 to 10 mm are available.

Here, as shown in FIG. 4, a thickness of side portions 32b3, 32b4 crossing the side portion 32b1 of the beam 32b is taken as t3. The uniform load applied to the side portion 32b3 and the side portion 32b4 of the beam 32b is equal. Therefore, if the thickness of the side portion 32b3 and the thickness of the side portion 32b4 are equal, the deflection of the side portion 32b3 and the deflection of the side portion 32b4 are offset. Therefore, the thickness t3 is not particularly limited. However, if the thickness t3 is too small, there is a risk that unintended deformation of the beam 32b occurs, and the position of the placement part 31 shifts. Therefore, "t1<t3" is preferable. If "t2<t3", the unintended deformation of the beam 32b is more easily suppressed.

Next, returning to FIG. 1, the power supply part 4, the power supply part 5, the depressurization part 6, the gas supplier 7, and the controller 8 will be described.

The power supply part 4 includes a power supply 41 and a matching part 42.

The power supply part 4 is a so called high frequency power supply for bias control. That is, the power supply part 4 is provided in order to control energy of ions attracted to the processed product 100 on the placement part 31.

The power supply 41 outputs a high frequency power having a frequency suitable for attracting ions (for example, frequency of 27 MHz to 1 MHz).

The matching part 42 includes a matching circuit 42a, a fan 42b, and the bus bar 42c.

The matching circuit 42a is provided in order to match between impedance on the power supply 41 side and impedance on the plasma P side. The matching circuit 42a is electrically connected to the power supply 41 and the electrode 31a via the bus bar (a wire member) 42c. That is, the power supply 41 is electrically connected to the electrode 31a provided on the placement part 31 via the bus bar 42c.

The detail of the configuration of the bus bar 42c will be described later.

The fan 42b sends air into the supporting part 32. The fan 42b is provided in order to cool the bus bar 42c and/or the matching circuit 42a provided inside the supporting part 32.

The matching part 42 can be provided on the flange 32c of the supporting part 32. If the matching part 42 is provided on the flange 32c, the placement module 3 and the matching part 42 can be moved integrally when detaching the placement module 3 from the chamber 2 (main body part 21) or attaching the placement module 3 to the chamber 2 (main body part 21). Therefore, the maintainability can be improved.

The internal space of the beam 32b is connected to the outside space of the chamber 2 (main body part 21) via the matching part 42. Therefore, the pressure of the internal space of the beam 32b is the same as the pressure (for example, atmospheric pressure) of the outside space of the chamber 2.

The power supply part 5 includes the electrode 51, a power supply 52, and a matching circuit 53.

The power supply part 5 can be a high frequency power supply for generating the plasma P. That is, the power supply part 5 is provided in order to generate the plasma P by causing a high frequency discharge inside the chamber 2.

In the embodiment, the power supply part 5 serves as a plasma generator generating the plasma P inside the chamber 2.

The electrode 51 is provided on the window 23 outside the chamber 2. The electrode 51 can include multiple conductor parts generating electromagnetic field and multiple capacity parts (capacitor).

The power supply 52 outputs a high frequency power having a frequency of approximately 100 KHz to 100 MHz. In this case, the power supply 52 can output a high frequency power having a frequency suitable for generating the plasma P (for example, frequency of 13.56 MHz). The power supply 52 can change the frequency of the output high frequency power as well.

The matching circuit 53 is provided in order to match between impedance on the power supply 52 side and impedance on the plasma P side. The matching circuit 53 is electrically connected to the power supply 52 and the electrode 51 via a wire 54. The matching circuit 53 can be electrically connected to the power supply 52 and the electrode 51 via the bus bar 42c as well.

The plasma processing apparatus 1 illustrated in FIG. 1 is a double frequency plasma processing apparatus including an inductively coupled electrode at the top and a capacitively coupled electrode at the lower part.

However, a generation method of plasma is not limited to the illustration.

The plasma processing apparatus 1 may be, for example, a plasma processing apparatus based on inductively coupled plasma (ICP) and/or a plasma processing apparatus based on capacitively coupled plasma (CCP) or the like.

The depressurization part 6 includes a pump 61 and a valve 62.

The depressurization part 6 is positioned below the placement part 31, and depressurizes the inside of the chamber 2 to a prescribed pressure.

The pump 61 can be provided outside the chamber 2. The pump 61 can be connected to a hole 21a1 (corresponding to one example of a second hole) provided on the bottom plate 21a of the chamber 2. The pump 61 exhausts the gas inside the chamber 2.

The pump 61 can be, for example, a turbo molecular pump (TMP) or the like.

The valve 62 includes a valve disc 62a and a drive part 62b.

The valve disc 62a presents a plate shape, and is provided inside the chamber 2. The valve disc 62a confronts the hole 21a1. A plane dimension of the valve disc 62a can be larger than a plane dimension of an inlet 61a. When viewing the valve disc 62a in a direction of the center axis 2a, the valve disc 62a covers the inlet 61a of the pump 61.

The drive part 62b changes the position of the valve disc 62a in the direction of the center axis 2a of the chamber 2 (main body part 21). That is, the drive part 62b raises the valve disc 62a and/or lowers the valve disc 62a. The drive part 62b can include a shaft 62a1 connected to the valve disc 62a and a control motor (for example, servo motor, etc.) moving the shaft 62a1. The valve 62 can be a so called poppet valve.

Here, when the position of the valve disc 62a changes inside the camber 2, a distance between the valve disc 62a and the bottom plate 21a of the chamber 2 changes. The space between the valve disc 62a and the bottom plate 21a of the chamber 2 serves as an exhaust flow path. Therefore, since conductance changes when the dimension of this portion is changed, an exhaust amount and/or a pumping speed or the like can be controlled. The drive part 62b can control, for example, the position of the valve disc 62a on the basis of the output of a not shown vacuum gauge or the like. which detects an internal pressure of the chamber 2.

The gas supplier 7 includes a gas storage part 71, a gas controller 72, and an on-off valve 73.

The gas supplier 7 supplies gas G to the region 21b where the plasma P is generated inside the chamber 2. The gas storage part 71, the gas controller 72, and the on-off valve 73 can be provided outside the chamber 2.

The gas storage part 71 stores the gas G and supplies the stored gas G into the chamber 2. The gas storage part 71 can be, for example, a high pressure cylinder, etc. storing the gas G. The gas storage part 71 and the gas controller 72 are connected via a piping.

The gas controller 72 controls a flow rate and/or pressure, etc. when supplying the gas G from the gas storage part 71 into the chamber 2. The gas controller 72 can be, for example, MFC (Mass Flow Controller), etc. The gas controller 72 and the on-off valve 73 are connected via a piping.

The on-off valve 73 is connected to a gas supply port 22b provided in the chamber 2 via a piping. The on-off valve 73 controls supply and stop of the gas G. The on-off valve 73 can be, for example, a 2 port electromagnetic valve, etc. The gas controller 72 also can have the function of the on-off valve 73.

When the gas G is excited and activated by the plasma P, desired radials and/or ions can be produced. For example, in the case where the gas G is subjected to the plasma processing such as etching processing, radicals and/or ions which can etch the exposed surface of the processed product 100 can be produced. In this case, the gas G can be, for example, a gas including chlorine and/or a gas including fluorine, etc. The gas G can be, for example, a mixed gas of chlorine gas and oxygen gas, $CHF_3$, a mixed gas of $CHF_3$ and $CF_4$, a mixed gas of $SF_6$ and Helium gas, etc.

The controller 8 includes an operation part such as CPU (Central Processing Unit) and a memory part such as a memory.

The controller 8 controls operations of components provided in the plasma processing apparatus 1 on the basis of a control program stored in the memory part. Since a well-known art can be applied to the control program controlling the operations of the components, the detailed description will be omitted.

Next, the configuration of the bus bar 42c will be further described.

Here, when by-products generated in the plasma processing remain inside the chamber, the plasma processing performance results in fluctuation. Therefore, maintenance is needed that the inside of the chamber is cleaned regularly and parts with adhered by-products are exchanged. In this case, if reassembly is performed with the bus bar detached, the impedance may change and the plasma processing performance may fluctuate, and thus it is preferable not to detach the bus bar as much as possible. That is, the bus bar is preferable not to lead to malfunction due to oxidation described later.

The bus bar is, generally, formed of copper of a highly conductive metal.

When a current is passed through the bus bar, a temperature of the bus bar rises due to Joule heat. In this case, if the bus bar is formed of copper, copper oxide is formed by oxidation of a surface of the bus bar. If the inside of the placement part is connected to the atmospheric space, and the bus bar contacts the atmospheric space with a high oxygen concentration, the bus bar is easily oxidized. Since a high frequency current flows in the vicinity of the bus bar surface due to a skin effect, when copper oxide with a higher resistance than copper is formed on the bus bar surface, the amount of heat generated increases and the temperature of the bus bar further rises. Therefore, energy loss due to the heat generation further increases, and thus plasma processing performance may drop. Since formation of copper oxide proceeds gradually with use of the plasma processing apparatus, the plasma processing performance results in instability.

In this case, if the bus bar is made large to increase the surface area, temperature rise of the bus bar can be suppressed. However, there is a risk that the enlarged bus bar causes upsizing of the apparatus and disposition of the bus bar becomes difficult.

The surface of the bus bar also can be coated with a material which is hard to be oxidized and has a low resistance to the high frequency current. However, since the bus bar used for the plasma processing apparatus is a large size part, coating the bus bar surface with gold results in increase of manufacturing cost. Coating the bus bar surface with silver can lower the manufacturing cost than covering with gold. However, silver is more susceptible than gold. In this case, oxidation of silver proceeds immediately after manufacturing the plasma processing apparatus, thereafter the oxidation of silver saturates with use of the plasma processing apparatus. Therefore, the initial fluctuation of the plasma processing performance may occur.

Oxygen can be removed from the environment provided with the bus bar by purging the environment provided with the bus bar with inactive gas and/or evacuating. However, in this way, complication and upsizing of the plasma processing apparatus are caused and manufacturing cost increases.

Then, the bus bar 42c according to the embodiment includes copper and gold, and a ratio of copper and gold changes in a thickness direction of the bus bar 42c.

Figure 6:
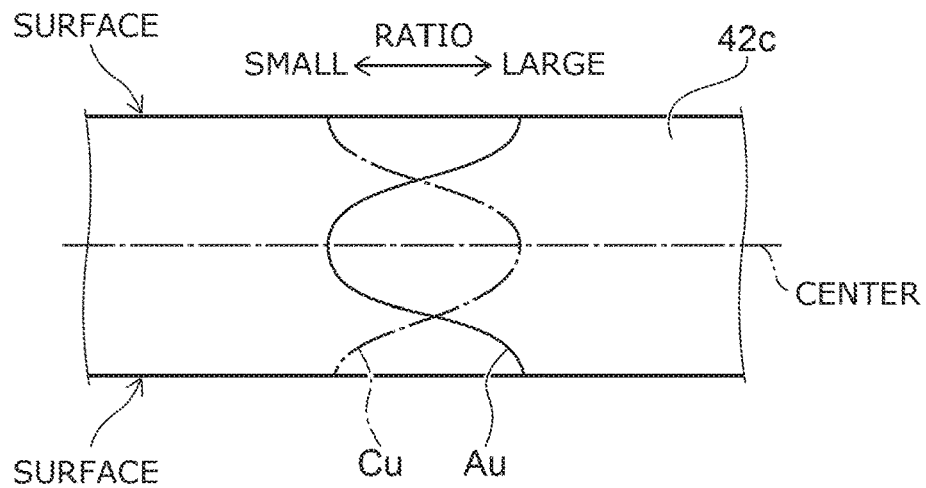
FIG. 6 is a schematic view for illustrating a ratio of copper and gold in a thickness direction of a bus bar.

FIG. 6 is a schematic view for illustrating the ratio of copper and gold in the thickness direction of the bus bar 42c.

As shown in FIG. 6, gold is more included than copper on a surface side of the bus bar 42c, and copper is more included than gold on a center side in the thickness direction of the bus bar 42c. That is, the bus bar 42c is formed of an alloy of copper and gold and gold is more included than copper on the surface side of the bus bar 42c.

Alternately, gold is more included than copper on the surface side of the bus bar 42c and only copper is included on the center side of the bus bar 42c. That is, the bus bar 42c includes a first layer formed of copper and a second layer covering the first layer formed of copper and formed of the alloy of copper and gold. Gold is more included than copper on a surface side of the second layer formed of the alloy of copper and gold, and copper is more included than gold on the first layer side formed of copper of the second layer formed of the alloy of copper and gold.

The bus bar 42c like this can be formed in the following way, for example.

The bus bar 42c can be formed by plating gold on a surface of the material (for example, band-like copper material) formed of copper.

Here, generally, in the case where gold is plated on the surface of the material formed of copper, nickel is plated on the surface of the material formed of copper, and gold is plated on the surface of a layer formed of nickel. However, there is a problem that the amount of heat generated increases due to high resistance of nickel. On the other hand, if the layer formed of nickel is not provided, gold results in diffusing into the material formed of copper when gold is plated. In this case, in order to form the surface side of the bus bar of almost gold, a plating condition is needed which gold is plated with approximately a few μm thickness. If thick gold is plated with some thickness, the diffusion saturates between the material formed of copper and the material formed of gold, and the surface side of the bus bar can be formed of almost gold. However, in this way, the amount of expensive gold increases, and thus the manufacturing cost of the bus bar increase extraordinarily. The high frequency current flows in the vicinity of the surface of the bus bar 42c, but resistivity of gold is lower than that of nickel and higher than that of copper by about two times. Therefore, if the vicinity of the surface of the bus bar is formed of almost gold by thick gold plating, the high frequency current is more difficult to transmit than the material formed of copper.

According to the embodiment, when forming the bus bar 42c, the plating condition is that thin gold is plated with a thickness of not less than 100 nm and not more than 150 nm. The thickness of the material formed of copper can be approximately 2 mm. Under the condition like this, it can be realized that when plating gold, the diffusion occurs between the material formed of copper and the plated gold, gold is more included than copper on the surface side of the bus bar 42c, and copper is more included than gold on the center side in the thickness direction of the bus bar 42c. Alternately, it can be realized that gold is more included than copper on the surface side of the bus bar 42c and only copper is included on the center side of the bus bar 42c. In this case, the ration of gold to copper (Au/Cu) on the surface of the formed bus bar 42c can be 51 weight % or more.

A diffusion depth of gold can be controlled by the plating thickness and the thickness of the material formed of copper. A heat treatment also can be performed for accelerating gold diffusion.

According to the bus bar 42c of the embodiment, the amount of included gold can be small, and thus the increase of the manufacturing cost of the bus bar 42c can be suppressed. Since the gold ratio of the surface side of the bus bar 42c can be large, the oxidation of the surface of the bus bar 42c can be suppressed. Therefore, even if blowing from the fan 42b in order to cool the bus bar 42c, the oxidation of the surface of the bus bar 42c can be suppressed. If temperature rise of the bus bar 42c can be suppressed by blow, the oxidation of the surface of the bus bar 42c can be suppressed.

The gold ratio is large in the vicinity of the surface of the bus bar 42c, and thus the resistance can be more decreased than plating. In this case, since the high frequency current flows in the vicinity of the surface of the bus bar 42c, if the resistance in the vicinity of the surface of the bus bar 42c is low, heat generation can be suppressed. Therefore, energy loss due to heat generation can be suppressed, and thus the plasma processing performance can be improved. On the other hand, the ratio of copper having lower resistance than gold can be large from the vicinity of the surface of the bus bar 42c toward the center by plating thin gold. Therefore, the high frequency current flowing in the vicinity of the surface of the bus bar 42c can be conducted efficiently.

As described above, in the bus bar 42c according to the embodiment, the oxidation of the bus bar 42c can be suppressed by the simple and inexpensive configuration.

Figure 7:
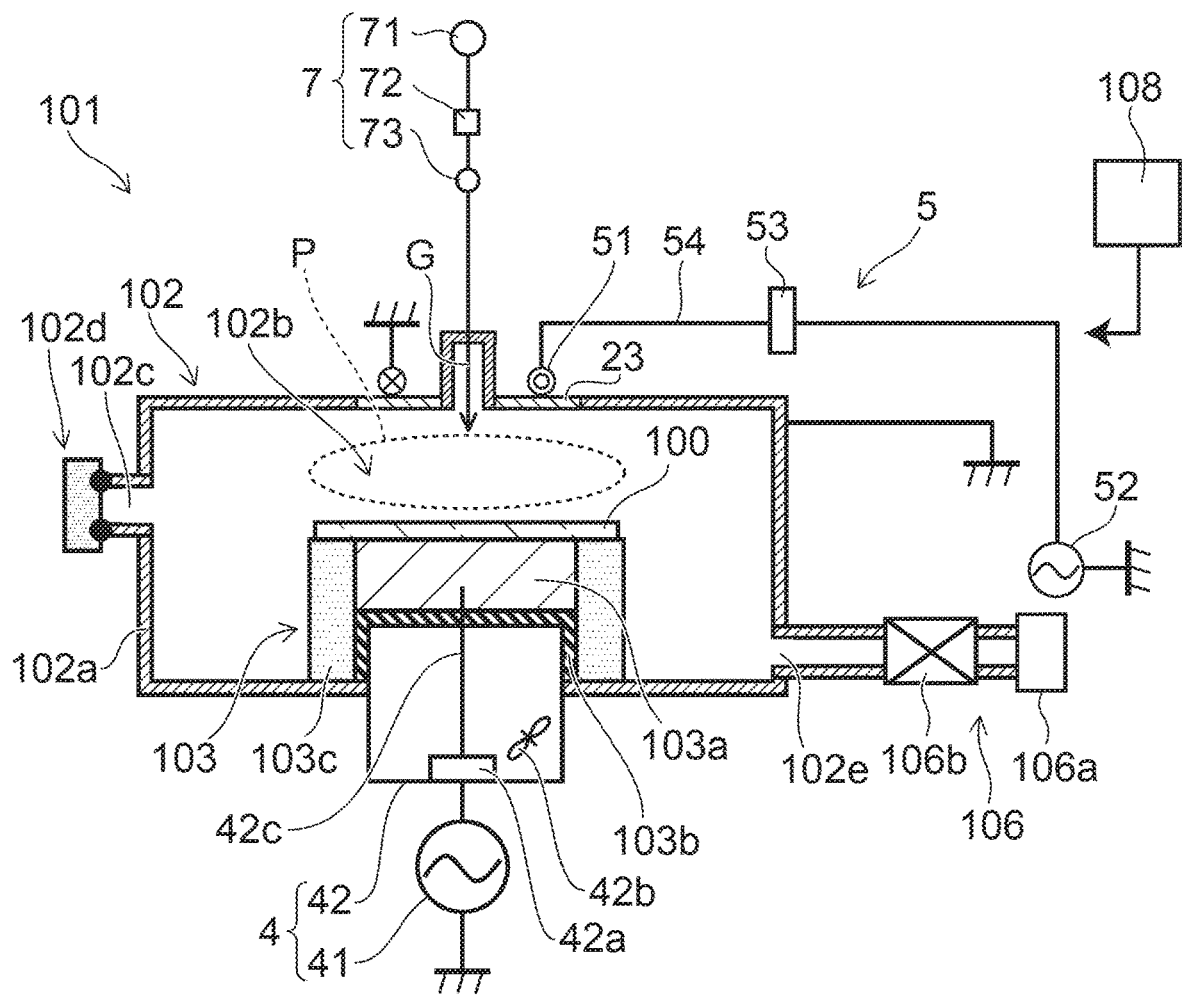
FIG. 7 is a schematic cross sectional view for illustrating a plasma processing apparatus according to other embodiment.

FIG. 7 is a schematic cross sectional view for illustrating a plasma processing apparatus 101 according to other embodiment.

As shown in FIG. 7, the plasma processing apparatus 101 includes a chamber 102, a placement module 103, the power supply part 4, the power supply part 5, a depressurization part 106, the gas supplier 7, and a controller 108. Also in the plasma processing apparatus 101, the power supply part 5 serves as a plasma generator generating the plasma P inside the chamber 102.

The chamber 102 has an airtight structure which is possible to maintain an atmosphere more depressurized than an atmospheric pressure.

The chamber 102 includes a main body part 102a, and the window 23.

The main body part 102a can be formed by integrating with a top board, a bottom plate, and a side part having an almost cylindrical shape. The main body part 102a can be formed of, for example, a metal such as an aluminum alloy. The main body part 102a can be grounded. A region 102b where the plasma P is generated is provided inside the main body part 102a. The main body part 102a is provided with a carry-in-and-out port 102c for carrying in and out the processed product 100. The carry-in-and-out port 102c is configured to be closed tightly by a gate valve 102d.

The placement part 103 is provided on the bottom surface of the main body part 102a inside the chamber 102 (main body part 102a). The placement part 103 includes an electrode 103a, a pedestal 103b, and an insulating ring 103c. The inside of the placement part 103 is connected to the atmospheric space.

The electrode 103a is provided below the region 102b where the plasma P is generated. An upper surface pf the electrode 103a can be a placement surface for placing the processed product 100. The electrode 103a can be formed of a conductive material such as a metal. The electrode 103a can incorporate multiple pickup pins 31a1 and a temperature controller or the like as well as the electrode 31a described above.

The pedestal 103b is provided between the electrode 103a and the bottom surface of the main body part 102a. The pedestal 103b is provided in order to insulate the electrode 103a from the main body part 102a. The pedestal 103b can be formed of, for example, a dielectric material such as quartz.

The insulating ring 103c presents a ring shape, and is provided to cover a side surface of the electrode 103a, and a side surface of the pedestal 103b. The insulating ring 103c can be formed of, for example, a dielectric material such as quartz.

The plasma processing apparatus 101 according to the embodiment also can include the power supply part 4 described above. As described above, the power supply part 4 is a so called high frequency power supply for bias control. The matching circuit 42a is electrically connected to the power supply 41 and the electrode 103a via the bus bar 42c. Since the inside of the placement part 103 is connected to the atmospheric space, the bus bar 42c contacts the atmospheric space. The configuration of the bus bar 42c can be the same as described above.

Since the plasma processing apparatus 101 according to the embodiment is provided with the bus bar 42c as well, the same effect as the effect of the plasma processing apparatus 1 described above can be available.

The plasma processing apparatus 101 is also a double frequency plasma processing apparatus including an inductively coupled electrode at the top and a capacitively coupled electrode at the lower part.

However, a generation method of plasma is not limited to the illustration.

The plasma processing apparatus 101 may be, for example, a plasma processing apparatus based on inductively coupled plasma (ICP) and/or a plasma processing apparatus based on capacitively coupled plasma (CCP) or the like.

The depressurization part 106 includes a pump 106a and a pressure controller 106b.

The depressurization part 106 depressurizes the inside the chamber 102 to the prescribed pressure. The pump 106a can be, for example, a turbo molecular pump or the like. The pump 106a and the pressure controller 106b are connected via a piping.

The pressure controller 106b controls the internal pressure of the chamber 102 to the prescribed pressure on the basis of the output of a not shown vacuum gauge, etc. which detects an internal pressure of the chamber 102. The pressure controller 106b can be, for example, APC (Auto Pressure Controller) or the like. The pressure controller 106b is connected to an outlet 102e provided on the main body part 102a via a piping.

The controller 108 includes an operation part such as CPU and a memory part such as a memory. The controller 108 controls operations of components provided in the plasma processing apparatus 101 on the basis of a control program stored in the memory part. Since a well-known art can be applied to the control program controlling the operations of the components, the detailed description will be omitted.

Embodiments have been illustrated. However, the invention is not limited to the description.

An appropriate design modification by a person skilled in the art as embodiments also is within the scope of the invention to the extent that the spirit of the invention is included.

For example, the shape, the material, the disposition, etc. of the components included in the plasma processing apparatuses 1, 101 are not limited to illustrations and can be changed appropriately.

The components included in the embodiments described above can be combined within the extent of feasibility, and the combinations are included in the scope of the invention to the extent that the feature of the invention is included.

What is claimed is:

1. A plasma processing apparatus, comprising:
    a chamber being possible to maintain an atmosphere more depressurized than atmospheric pressure;
    plasma generator generating a plasma inside the chamber;
    a gas supplier supplying a gas into the chamber;
    a placement part, the placement part being positioned below a region where the plasma is generated, a processed product being placed on the placement part;
    a depressurization part depressurizing inside of the chamber; and
    a power supply electrically connected to an electrode, the electrode being provided on the placement part via a bus bar,
    the bus bar being formed of an alloy of copper and gold, the alloy of copper and gold being exposed on a surface of the bus bar, the gold being more included than the copper on a surface side of the bus bar, the copper being more included than the gold on a center side in a thickness direction of the bus bar, or
    the bus bar including a first layer formed of the copper and a second layer covering the first layer and being formed of an alloy of the copper and the gold, the alloy of copper and gold being exposed on a surface of the second layer, the gold being more included than the copper on a surface side of the second layer, the copper being more included than the gold on a side of the first layer of the second layer;
    wherein the plasma processing chamber is further comprising:
    a supporting part supporting the placement part in an internal space of the chamber, the supporting part including
    a mounting part positioned below the placement part and provided with the placement part, and
    a beam extending inside the chamber from a side surface of the chamber toward a center axis of the chamber, one end of the beam being connected to a side surface of the mounting part, an internal main space of the beam being connected to an outside space of the chamber,
    a thickness of a side part on the placement part side of side parts of the beam is as t1, the placement part side of side parts of the beam is from a top of the internal main space to a top of the beam, t1 is 14 mm to 18 mm,
    a thickness of a side part on an opposite side of the placement part of the beam is t2, the opposite side of the placement part side of the beam is from a bottom of the internal main space to a bottom of the beam, t2 is 8 mm to 10 mm,
    a distance between an outer wall of the chamber and the center axis of the chamber is L, L is 260 to 350 mm, and
    a weight of the placement part is W, W is 56 to 70 kgf (weight kilogram).

2. The plasma processing apparatus according to claim 1, wherein
    a ratio of the gold to the copper on the surface of the bus bar or the surface of the second layer is 51 weight % or more.

3. The plasma processing apparatus according to claim 2, wherein
the placement part is connected to an atmospheric space, and the bus bar contacts the atmospheric space.

4. The plasma processing apparatus according to claim 3, further comprising:
a fan blowing toward the bus bar.

5. The plasma processing apparatus according to claim 4, wherein when a thickness of a side part crossing the side part on the placement part side of the beam is taken as t3, a following formula is satisfied, t1<t3.

6. The plasma processing apparatus according to claim 5, wherein
the supporting part further includes a flange provided on an outer wall of the chamber,
other end of the beam is connected to the flange via a first hole piercing the side surface of the chamber.

7. The plasma processing apparatus according to claim 6, wherein
the mounting part provided with the placement part and the beam are possible to be carried into the chamber and to be carried out of the chamber.

8. The plasma processing apparatus according to claim 7, wherein the depressurization part includes
a pump connected to a second hole provided in a bottom plate of the chamber,
a valve disc provided inside the chamber and confronting the second hole, and
a drive part configured to change a position of the valve disc in a center axis direction of the chamber.

9. The plasma processing apparatus according to claim 1, wherein
the placement part is connected to an atmospheric space, and the bus bar contacts the atmospheric space.

10. The plasma processing apparatus according to claim 1, further comprising:
a fan blowing toward the bus bar.

11. The plasma processing apparatus according to claim 1, wherein when a thickness of a side part crossing the side part on the placement part side of the beam is taken as t3, a following formula is satisfied, t1<t3.

12. The plasma processing apparatus according to claim 1, wherein the supporting part further includes a flange provided on an outer wall of the chamber, other end of the beam is connected to the flange via a first hole piercing the side surface of the chamber.

13. The plasma processing apparatus according to claim 12, wherein
the mounting part and the beam provided with the placement part are able to be carried in the chamber and carried out of the chamber.

14. The plasma processing apparatus according to claim 1, wherein the depressurization part includes
a pump connected to a second hole provided in a bottom plate of the chamber,
a valve disc provided inside the chamber and confronting the second hole, and
a drive part configured to change a position of the valve disc in a center axis direction of the chamber.

15. The plasma processing apparatus according to claim 1, the power supply outputting a high frequency power having a frequency of 27 MHz to 1 MHz.

16. A plasma processing apparatus, comprising:
a chamber being possible to maintain an atmosphere more depressurized than atmospheric pressure;
a plasma generator generating a plasma inside the chamber;
a gas supplier supplying a gas into the chamber;
a placement part, the placement part being positioned below a region where the plasma is generated, a processed product being placed on the placement part;
a depressurization part depressurizing inside of the chamber; and
a power supply electrically connected to an electrode, the electrode being provided on the placement part via a bus bar,
the bus bar including a first layer and a second layer formed on a surface of the first layer and covering the first layer, the first layer including copper, and a thickness of the first layer being 2 mm, the second layer being formed under a condition of applying thin gold plating having a thickness of not less than 100 nm and not more than 150 nm,
a ratio of the gold to the copper on the surface of the second layer being 51 weight % or more;
wherein the plasma, processing chamber is further comprising:
a supporting part supporting the placement part in an internal space of the chamber, the supporting part including
a mounting part positioned below the placement part and provided with the placement part, and
a beam extending inside the chamber from a sine surface of the chamber toward a center axis of the chamber, one end of the beam being connected to a side surface of the mounting part, an internal main space of the beam being connected to an outside space of the chamber,
a thickness of a side part on the placement part side of side parts of the beam is as t1, the placement part side of side parts of the beam is from a top of the internal main space to a top of the beam, t1 is 14 mm to 18 mm,
thickness of a side part on an opposite side of the placement part of the beam is t2, the opposite side of the placement part side of the beam is from a bottom of the internal main space to a bottom of the beam, t2 is 8 mm to 10 mm,
a distance between an outer wall of the chamber and the center axis of the chamber is L, L is 260 to 350 mm, and
a weight of the placement part is W, W is 56 to 70 kgf (weight kilogram).

* * * * *

UNITED STATES PATENT AND TRADEMARK OFFICE
CERTIFICATE OF CORRECTION

PATENT NO. : 11,387,082 B2
APPLICATION NO. : 16/581886
DATED : July 12, 2022
INVENTOR(S) : Hidehito Azumano It is certified that error appears in the above-identified patent and that said Letters Patent is hereby corrected as shown below:

In the Claims

Column 14, Line 14, "plasma generator generating" should read --a plasma generator generating--

Column 16, Line 38, "from a sine surface" should read --from a side surface--

Column 16, Line 47, "thickness of a side part" should read --a thickness of a side part--

Signed and Sealed this
Fourteenth Day of March, 2023

Katherine Kelly Vidal
*Director of the United States Patent and Trademark Office*